US010274556B2

(12) United States Patent
Tong et al.

(10) Patent No.: US 10,274,556 B2
(45) Date of Patent: Apr. 30, 2019

(54) RADIO FREQUENCY COIL APPARATUS FOR A MAGNETIC RESONANCE IMAGING SYSTEM

(71) Applicant: General Electric Company, Schenectady, NY (US)

(72) Inventors: Sheng Tong, Beijing (CN); Cong Zhang, Beijing (CN); Yonghui Jiang, Beijing (CN); Jiaqi Li, Waukesha, WI (US); Xuelian Lu, Beijing (CN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 211 days.

(21) Appl. No.: 15/280,474

(22) Filed: Sep. 29, 2016

(65) Prior Publication Data

US 2017/0089990 A1 Mar. 30, 2017

(30) Foreign Application Priority Data

Sep. 29, 2015 (CN) .......................... 2015 1 0638260

(51) Int. Cl.
*G01V 3/00* (2006.01)
*G01R 33/34* (2006.01)
(52) U.S. Cl.
CPC . *G01R 33/34046* (2013.01); *G01R 33/34084* (2013.01)
(58) Field of Classification Search
CPC .............................. G01R 33/34046

USPC .................................................. 324/318, 322
See application file for complete search history.

(56) References Cited

U.S. PATENT DOCUMENTS

| 6,100,694 | A | * | 8/2000 | Wong | ............... | G01R 33/34046 |
| | | | | | | 324/318 |
| 7,501,828 | B1 | * | 3/2009 | Wong | ............... | G01R 33/34046 |
| | | | | | | 324/318 |
| 8,049,502 | B2 | * | 11/2011 | Odintsov | ......... | G01R 33/34046 |
| | | | | | | 324/309 |

* cited by examiner

*Primary Examiner* — Louis M Arana

(57) ABSTRACT

A radio frequency coil apparatus for a magnetic resonance imaging system comprising an inductor circular carrier, a first capacitor circular carrier, and a second capacitor circular carrier. A plurality of inductor bars are provided at intervals on the inductor circular carrier. A plurality of first capacitor elements are provided on the first capacitor circular carrier, the first capacitor circular carrier being configured to be detachably connected to one end of the inductor circular carrier, the plurality of first capacitor elements being configured to be connected to one end of the plurality of inductor bars. A plurality of second capacitor elements are provided on the second capacitor circular carrier, the second capacitor circular carrier being configured to be detachably connected to the other end of the inductor circular carrier, the plurality of second capacitor elements being configured to be connected to the other end of the plurality of inductor bars.

10 Claims, 2 Drawing Sheets

RADIO FREQUENCY COIL APPARATUS FOR A MAGNETIC RESONANCE IMAGING SYSTEM

CROSS-REFERENCE TO RELATED APPLICATIONS

This application claims priority to Chinese patent application number 201510638260.6, filed on Sep. 29, 2015, the entirety of which is incorporated herein by reference.

BACKGROUND

The present invention relates to the field of medical imaging, particularly to a radio frequency (RF) coil apparatus and a magnetic resonance imaging apparatus.

A magnetic resonance (MR) imaging system includes a radio frequency coil and a gradient coil. The radio frequency coil is used for emitting a radio frequency pulse with a certain frequency and power so that hydrogen protons within the detected body produce resonance, and for receiving a magnetic resonance signal produced by the hydrogen protons within the detected body, the magnetic resonance signal being used for image reconstruction of a detected part of the detected body. The gradient coil is used for emitting a level selecting gradient pulse, a phase encoding gradient pulse and a frequency encoding gradient pulse (also referred to as a read out gradient pulse) to provide three-dimensional position information for the above magnetic resonance signal so as to implement the image reconstruction.

In a magnetic resonance imaging system, usually many kinds of radio frequency coils need to be specially designed to satisfy different clinical applications, e.g., different parameter requirements or performance requirements. Since different kinds of radio frequency coils cannot be used interchangeably with each other, when imaging parameters need to be adjusted, e.g., when a scanning field of view (FOV) needs to be adjusted, usually the whole radio frequency coil needs to be replaced, which results in many problems. For example, during research and development of a new product, even though a certain parameter needs to be adjusted slightly, a new radio frequency coil still needs to be redesigned, e.g., a new carrier needs to be designed and circuit elements on the carrier need to be replaced, resulting in an increased time cost on the research and development. Since research and development personnel need to save lots of backup radio frequency devices every time when a new radio frequency coil is designed, as the number of the saved radio frequency devices continuously increases, a stock of the elements increases so as to increase the cost, and it is very easy to misuse the devices during the design so as to bring a risk to the design. Once a radio frequency coil has been designed, it cannot be altered such that the magnetic resonance imaging system can only satisfy limited sets of parameter requirements, and a small range of usage even cannot satisfy the special customization of the users. If a certain part of the radio frequency coil is damaged or a certain element of the radio frequency coil has failed, the whole radio frequency coil needs to be replaced, which results in a waste of resources.

SUMMARY

One objective of the present invention is to provide a radio frequency coil apparatus capable of being flexibly configured and quickly satisfying different parameter requirements and a magnetic resonance imaging system having the radio frequency coil apparatus.

An exemplary embodiment of the present invention provides a radio frequency coil apparatus, comprising an inductor circular carrier, a first capacitor circular carrier, and a second capacitor circular carrier. A plurality of inductor bars are provided at intervals on the inductor circular carrier circumferentially. A plurality of first capacitor elements are provided on the first capacitor circular carrier circumferentially, the first capacitor circular carrier being configured to be detachably connected to one end of the inductor circular carrier, the plurality of first capacitor elements being configured to be pluggably connected to one end of the plurality of inductor bars correspondingly. A plurality of second capacitor elements are provided on the second capacitor circular carrier circumferentially, the second capacitor circular carrier being configured to be detachably connected to the other end of the inductor circular carrier, the plurality of second capacitor elements being configured to be pluggably connected to the other end of the plurality of inductor bars correspondingly.

An exemplary embodiment of the present invention also provides a magnetic resonance imaging system, in which the above radio frequency coil apparatus is mounted.

Other features and aspects will be apparent through the following detailed description, figures and claims.

BRIEF DESCRIPTION OF THE DRAWINGS

The present invention can be understood better in light of the description of exemplary embodiments of the present invention with reference to the accompanying drawings, in which.

DETAILED DESCRIPTION

Hereafter, a detailed description will be given for preferred embodiments of the present disclosure. It should be pointed out that in the detailed description of the embodiments, for simplicity and conciseness, it is impossible for the Description to describe all the features of the practical embodiments in details. It should be understood that in the process of a practical implementation of any embodiment, just as in the process of an engineering project or a designing project, in order to achieve a specific goal of the developer and in order to satisfy some system-related or business-related constraints, a variety of decisions will usually be made, which will also be varied from one embodiment to another. In addition, it can also be understood that although the effort made in such developing process may be complex and time-consuming, some variations such as design, manufacture and production on the basis of the technical contents disclosed in the disclosure are just customary technical means in the art for those of ordinary skilled in the art associated with the contents disclosed in the present disclosure, which should not be regarded as insufficient disclosure of the present disclosure.

Unless defined otherwise, all the technical or scientific terms used in the Claims and the Description should have the same meanings as commonly understood by one of ordinary skilled in the art to which the present disclosure belongs. The terms "first", "second" and the like in the Description and the Claims of the present application for invention do not mean any sequential order, number or importance, but are only used for distinguishing different components. The terms "a", "an" and the like do not denote a limitation of quantity, but denote the existence of at least one. The terms "comprises", "comprising", "includes", "including" and the like mean that the element or object in front of the "comprises", "comprising", "includes" and "including" covers the elements or objects and their equivalents illustrated following the "comprises", "comprising", "includes" and "including", but do not exclude other elements or objects. The term "coupled" or "connected" or the like is not limited to being connected physically or mechanically, nor limited to being connected directly or indirectly.

Figure 1:
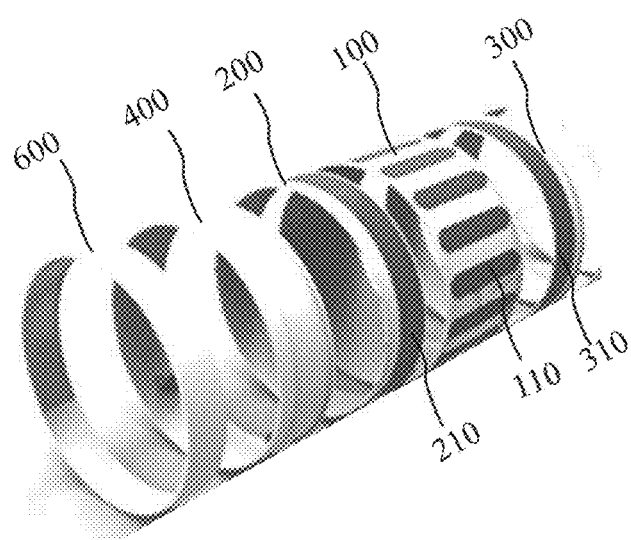
FIG. 1 and FIG. 2 are both a structural schematic diagram of a radio frequency coil apparatus provided by one embodiment of the present invention.
Figure 2:
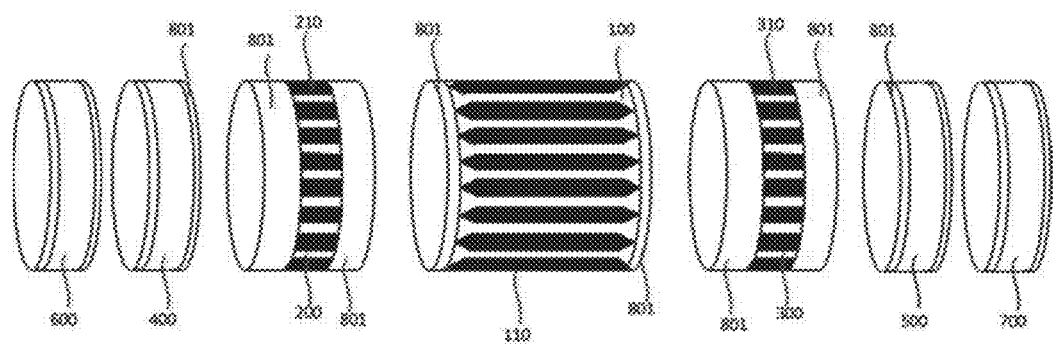

FIG. 1 and FIG. 2 are both a structural schematic diagram of a radio frequency coil apparatus provided by one embodiment of the present invention. As shown in FIG. 1 and FIG. 2, the radio frequency coil apparatus includes an inductor circular carrier 100, a first capacitor circular carrier 200, and a second inductor circular carrier 300. The first capacitor circular carrier 200 is configured to be detachably connected to one end of the inductor circular carrier 100, and the second capacitor circular carrier 300 is configured to be detachably connected to the other end of the inductor circular carrier 100. In this configuration manner, the radio frequency coil apparatus is in shape of a bird cage as a whole. Since the inductor circular carrier 100, the first capacitor circular carrier 200, and the second inductor circular carrier 300 are detachably connected with each other, so that one of them can be replaced according to the requirements.

A plurality of inductor bars 110 are provided at intervals along a circumferential direction of the inductor circular carrier 100; a plurality of first capacitor elements 210 are provided along a circumferential direction of the first capacitor circular carrier 200; a plurality of second capacitor elements 310 are provided along a circumferential direction of the second capacitor circular carrier 300. The plurality of first capacitor elements 210 are configured to be pluggably connected to one end of the plurality of inductor bars 110 correspondingly, and the plurality of second capacitor elements 310 are configured to be pluggably connected to the other end of the plurality of inductor bars 110. Since the first capacitor elements 210, the inductor bars 110 and the second capacitor elements 310 are pluggably connected with each other, when the inductor circular carrier 100, the first capacitor circular carrier 200 and the second inductor circular carrier 300 at which the first capacitor elements 210, the inductor bars 110 and the second capacitor elements 310 are located are replaced, new first capacitor elements 210, inductor bars 110 and second capacitor elements 310 can be quickly re-connected with each other to form a new radio frequency coil apparatus.

The above plurality of inductor bars 110 and the plurality of first capacitor elements 210 and the plurality of second capacitor elements 310 that are connected to the plurality of inductor bars 110 may be an equivalence to a loop radio frequency coil to emit a radio frequency pulse or receive a magnetic resonance signal.

Optionally, each of the inductor bars 110 is a conductive metal sheet, e.g., a copper sheet.

Optionally, as one implementation, the plurality of first capacitor elements 210 and the plurality of second capacitor elements 310 described above can be capacitors available from capacitor manufacturers, e.g., electrolytic capacitors, ceramic capacitors, etc., and such capacitors are fixed on the first capacitor circular carrier 200 in a manner including, but not limited to, soldering, plugging, and the like.

Figure 3:
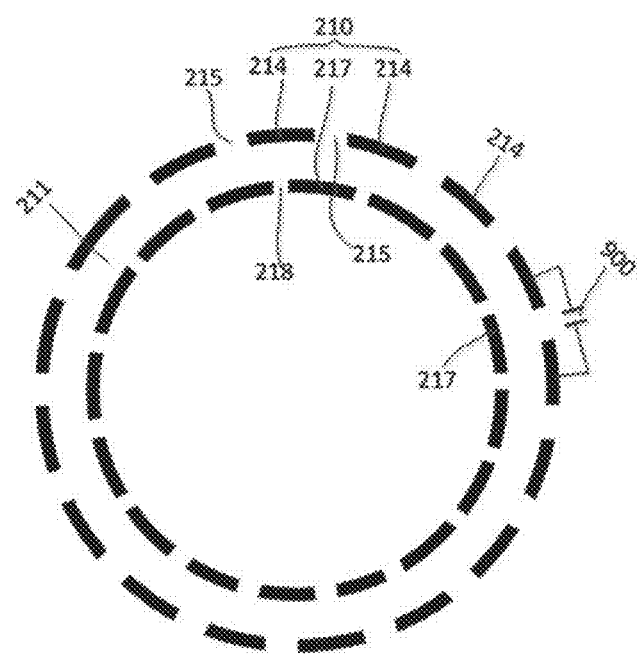
FIG. 3 is a structural schematic diagram of a plurality of first capacitor elements in FIG. 1.

FIG. 3 is a structural schematic diagram of the plurality of first capacitor elements 210 in FIG. 1. As shown in FIG. 2, as another implementation, the above plurality of first capacitor elements 210 can also be formed in the following configuration. A first substrate 211 is provided on an outer surface of the first capacitor circular carrier 200 circumferentially, a plurality of first conductive metal sheets 214 being provided on an upper surface of the first substrate 211 circumferentially, a plurality of second conductive metal sheets 217 being provided on a lower surface of the first substrate 211 circumferentially, a first interval 215 being provided between every two adjacent first conductive metal sheets 214, a second interval 218 being provided between every two adjacent second conductive metal sheets 217, each second conductive metal sheet 217 being opposite to one first interval 215 radially and overlapping with parts of two adjacent first conductive metal sheets 214 respectively.

Accordingly, each of the second conductive metal sheets 217 and two first conductive metal sheets 214 adjacent to the second conductive metal sheet 217 form one first capacitor element 210, and the size of the part that the first conductive metal sheets 214 and the second conductive metal sheet 217 overlap radially decides a capacitance value of the first capacitor element 210.

The above "conductive metal sheet" may include, for example, a copper sheet. The above first substrate 211 is formed of a material that facilitates in forming a capacitor, e.g., a dielectric material.

The first conductive metal sheet 214 and the second conductive metal sheet 217 described above may be formed on the first substrate 211, for example, in a graphical manner. The first substrate 211 formed with the first conductive metal sheet 214 and the second conductive metal sheet 217 may be formed on the outer surface of the first capacitor circular carrier 200, for example, by the way of adhesion. More specifically, a groove or shaft shoulder for placing the first substrate 211 may be provided on the outer surface of the first capacitor circular carrier 200.

In an embodiment, a plurality of second capacitor elements 310 having the same structure as the above plurality of first capacitor elements 210 may be formed according to the same principle and in the same configuration. For example, a second substrate is provided on an outer surface of the second capacitor circular carrier 300 circumferentially, a plurality of third conductive metal sheets are provided on an upper surface of the second substrate circumferentially, a plurality of fourth conductive metal sheets are provided on a lower surface of the second substrate circumferentially, a third interval is provided between every two adjacent third conductive metal sheets, a fourth interval is provided between every two adjacent fourth conductive metal sheets, and each fourth conductive metal sheet is opposite to one third interval radially and overlaps with parts of two adjacent third conductive metal sheets respectively.

Optionally, one or more third capacitor elements 900 are connected between any two adjacent first conductive metal sheets 214 or any two adjacent third conductive metal sheets. In this way, one or more third capacitor elements can be connected in parallel to one or more first capacitor elements 210, or one or more third capacitor elements can be connected in parallel to one or more second capacitor elements 310. Accordingly, a slight adjustment of the capacitance value according to the performance parameters of the magnetic resonance scanning may be implemented by connecting the third capacitor element(s) so as to avoid direct replacement of the first capacitor element(s) 210 or the second capacitor element(s) 310. The above manner of connecting the capacitor elements includes, but is not limited to, soldering, plugging, and the like.

Optionally, a first inductor interface and a second inductor interface are connected at two ends of each of the inductor bars 110 respectively, and the first inductor interface and the second inductor interface connected to the plurality of inductor bars 110 respectively are provided on the inductor circular carrier. Each of the first capacitor elements 210 is connected with a first capacitor interface, and the first capacitor interface connected to the plurality of first capacitor elements 210 respectively is pluggably connected with the first inductor interface of the plurality of inductor bars 110. Each of the second capacitor elements 310 is connected with a second capacitor interface, and the second capacitor interface connected to the plurality of second capacitor elements 310 respectively is pluggably connected with the second inductor interface of the plurality of inductor bars 110.

In the above manner, quick connection or quick disconnection between each inductor bar 110 and the corresponding first capacitor element and second capacitor element is achieved so that the inductor circular carrier 100, the first capacitor circular carrier 200 or the second capacitor circular carrier 300 of the radio frequency coil apparatus can be more conveniently replaced.

Optionally, the radio frequency coil apparatus of the embodiment of the present invention also includes a radio frequency feed-in arc carrier 400 and a decoupling arc carrier 500. A radio frequency feed-in circuit (not shown in the figure) is provided on the radio frequency feed-in arc carrier 400, and the radio frequency feed-in arc carrier 400 is configured to be detachably connected to the first capacitor circular carrier 200, the radio frequency feed-in circuit being configured to be pluggably connected to one of the plurality of first capacitor elements 210. A decoupling circuit (not shown in the figure) is provided on the decoupling arc carrier 500, and the decoupling arc carrier 500 is configured to be detachably connected to the second capacitor circular carrier 300, the decoupling circuit being configured to be pluggably connected to one of the plurality of second capacitor elements 310.

Those skilled in the art should understand that the above "radio frequency feed-in circuit" is used for transmitting a current control signal to the radio frequency coil so as to control the radio frequency coil to emit a radio frequency magnetic pulse, and the above "decoupling circuit", as a switch, is used for switching the radio frequency coil to operate in an emitting mode or a receiving mode.

The above radio frequency feed-in circuit may be fixed on the radio frequency feed-in arc carrier 400 in a certain shape and in a certain path by the way of adhesion, buckling and the like. Similarly, the decoupling circuit may also be fixed on the decoupling arc carrier 500 in a certain shape and in a certain path by the way of adhesion, buckling and the like. Specifically, a groove for receiving the circuit may be provided on outer surfaces of the radio frequency feed-in arc carrier 400 and the decoupling arc carrier 500 respectively.

Moreover, in order to achieve quick connection or disconnection between the radio frequency feed-in circuit and the first capacitor elements 210, a third capacitor interface connected to any one of the first capacitor elements 210 may be provided on the first capacitor circular carrier 200, a radio frequency feed-in circuit interface connected to the radio frequency feed-in circuit may be provided on the radio frequency feed-in arc carrier 400, and the third capacitor interface and the radio frequency feed-in circuit interface can be pluggably connected. In order to achieve quick connection or disconnection between the decoupling circuit and any one of the second capacitor elements 310, a fourth capacitor interface connected to any one of the second capacitor elements 310 may be provided on the second capacitor circular carrier 300, a decoupling circuit interface connected to the decoupling circuit may be provided on the decoupling arc carrier 500, and the fourth capacitor interface and the decoupling circuit interface can be pluggably connected.

Optionally, in the embodiment of the present invention, two ends of the inductor circular carrier 100, two ends of the first capacitor circular carrier 200, two ends of the second capacitor circular carrier 300, one end of the radio frequency feed-in arc carrier 400, and one end of the decoupling arc carrier 500 extend outwards respectively to form mounting portions 801, the radio frequency feed-in arc carrier 400, the first capacitor circular carrier 200, the inductor circular carrier 100, the second capacitor circular carrier 300, and the decoupling arc carrier 500 described above are configured to be detachably connected in turn, in which every two adjacent mounting portions 801 are configured to be capable of being sleeved or screwed with each other. In this way, the mounting structure of each circular or arc carrier of the radio frequency coil apparatus is more reliable, and each circular or arc carrier described above is replaced more conveniently.

Optionally, in order to further improve the reliability of the mounting structure of each circular or arc carrier, the radio frequency coil apparatus of the embodiment of the present invention also includes one or more fixing members (not shown in the figure), each used for fixing two mounting portions 801 sleeved or screwed with each other together. For example, the fixing members include, but are not limited to, a locking structure, a buckling structure, and the like.

Optionally, a first arc mounting member 600 opposite to the first capacitor circular carrier 200 is connected at one end of the radio frequency feed-in arc carrier 400, a second arc mounting member 700 opposite to the second capacitor circular carrier 300 is connected at one end of the decoupling arc carrier 500, the first arc mounting member 600 and the second arc mounting member 700 are used for mounting the radio frequency coil apparatus in the magnetic resonance imaging apparatus, including, but not limited to, connecting the first arc mounting member 600 and the second arc mounting member 700 on a magnet or a floor of a member to be scanned by means of a bracket and the like.

Specifically, the radio frequency feed-in arc carrier 400 and the decoupling arc carrier 500 described above may be configured to be detachably connected to the first arc mounting member 600 and the second arc mounting member 700 respectively.

The above "arc" includes both the condition in which the member is a circle as a whole and the condition in which the member is only a section of a circle, e.g., a segment of arc. In the latter condition, the other section of arc of the circle that the radio frequency feed-in arc carrier 400 does not have may serve as one separate part, connected on a part adjacent to the radio frequency feed-in arc carrier 400 (e.g., connected on the first capacitor circular carrier 200, on the first arc mounting member 600, or on a part of the other section of arc of the circle that the first arc mounting member does not have), and forming an integral circular part together with the radio frequency feed-in arc carrier 400. The other section of arc of the circle that the decoupling arc carrier 500 does not have may also serve as one separate part, connected on a part adjacent to the decoupling arc carrier 500 (e.g., connected on the second capacitor circular carrier 300, on the second arc mounting member 700, or on a part of the other section of arc of the circle that the second arc mounting member 700 does not have), and forming an integral circular part together with the decoupling arc carrier 500.

Also, in the latter condition described above, the other sections of arcs of the circles that the first arc mounting member 600 and the second arc mounting member 700 do not have may also serve as one separate part, connected on another part adjacent to the corresponding mounting member (e.g., a part of the other section of arc of the circle that the first arc mounting member 600 does not have is connected on the radio frequency feed-in arc carrier 400 or connected on an arc part that is connected with the radio frequency feed-in arc carrier 400 to form a circle).

In an embodiment of the present invention, the radio frequency coil apparatus includes a plurality of circular carriers that are detachably connected, and a plurality of inductor bars and capacitor elements that are pluggably connected to two ends of the inductor bars are provided on each of the circular or arc carriers circumferentially respectively, the plurality of inductor bars and the capacitor elements at two ends thereof are equivalent to form a loop radio frequency coil. By replacing the circular carrier carrying the capacitor elements or the inductor bars, various parameter requirements of the magnetic resonance scanning may be satisfied, avoiding multiple times of redesigning of the radio frequency coil during the research and development, reducing the cost on research and development, and avoiding a hoard of the radio frequency devices for designing a new radio frequency coil. By replacing the circular carrier, it is very easy to satisfy the use's special customization of performance parameters such as a scanning field of view (FOV), etc. Moreover, when some parts of the radio frequency coil apparatus are damaged or some elements of the radio frequency coil apparatus are failed, the radio frequency coil apparatus can be repaired by replacing the corresponding portions, which saves the resource.

For example, other circular carriers other than the inductor circular carrier may be used as a standard member, and inductor circular carriers of different sizes (e.g., shaft length) may be backed up to serve as replaceable members. Lengths of inductor bars provided on the inductor circular carrier of each size may be different. The inductor bars of each length may be used to satisfy one parameter requirement of a scanning field of view. The inductor circular carrier may be replaced according to clinical requirements of different products, saving time on development of different products, which is very convenient.

Some exemplary embodiments have been described in the above. However, it should be understood that various modifications may be made thereto. For example, if the described techniques are carried out in different orders, and/or if the components in the described system, architecture, apparatus or circuit are combined in different ways and/or replaced or supplemented by additional components or equivalents thereof, proper results may still be achieved. Accordingly, other embodiments are also falling within the protection scope of the claims.

What is claimed is:

1. A radio frequency coil apparatus, comprising:
an inductor circular carrier, on which a plurality of inductor bars are provided at intervals circumferentially;
a first capacitor circular carrier, on which a plurality of first capacitor elements are provided circumferentially, said first capacitor circular carrier being configured to be detachably connected to one end of said inductor circular carrier, said plurality of first capacitor elements being plugged to one end of said plurality of inductor bars correspondingly; and
a second capacitor circular carrier, on which a plurality of second capacitor elements are provided circumferentially, said second capacitor circular carrier being configured to be detachably connected to the other end of said inductor circular carrier, said plurality of second capacitor elements being plugged to the other end of said plurality of inductor bars correspondingly.

2. The radio frequency coil apparatus according to claim 1, wherein:
a first substrate is provided on an outer surface of said first capacitor circular carrier circumferentially, a plurality of first conductive metal sheets are provided on an upper surface of said first substrate circumferentially, a plurality of second conductive metal sheets are provided on a lower surface of said first substrate circumferentially, a first interval is provided between every two adjacent first conductive metal sheets, a second interval is provided between every two adjacent second conductive metal sheets, each first conductive metal sheet is opposite to one second interval radially and overlaps with parts of two adjacent second conductive metal sheets respectively; and
a second substrate is provided on an outer surface of said second capacitor circular carrier circumferentially, a plurality of third conductive metal sheets are provided on an upper surface of said second substrate circumferentially, a plurality of fourth conductive metal sheets are provided on a lower surface of said second substrate circumferentially, a third interval is provided between every two adjacent third conductive metal sheets, a fourth interval is provided between every two adjacent fourth conductive metal sheets, each third conductive metal sheet is opposite to one fourth interval radially and overlaps with parts of two adjacent fourth conductive metal sheets respectively.

3. The radio frequency coil apparatus according to claim 2, wherein one or more third capacitor elements are connected between any two adjacent first conductive metal sheets or any two adjacent third conductive metal sheets.

4. The radio frequency coil apparatus according to claim 1, wherein each of said inductor bars is a conductive metal sheet.

5. The radio frequency coil apparatus according to claim 1, wherein:
a first inductor interface and a second inductor interface are connected at two ends of each of said inductor bars respectively, and the first inductor interfaces and the second inductor interfaces connected to said plurality of inductor bars respectively are provided on said inductor circular carrier;
each of said first capacitor elements is connected with a first capacitor interface, the first capacitor interfaces connected to said plurality of first capacitor elements respectively are connected with the first inductor interfaces of said plurality of inductor bars; and
each of said second capacitor elements is connected with a second capacitor interface, the second capacitor interfaces connected to said plurality of second capacitor elements respectively are connected with the second inductor interfaces of said plurality of inductor bars.

6. The radio frequency coil apparatus according to claim 1, wherein said radio frequency coil apparatus further comprises:

a radio frequency feed-in arc carrier, on which a radio frequency feed-in circuit is provided, said radio frequency feed-in arc carrier being configured to be detachably connected to said first capacitor circular carrier, said radio frequency feed-in circuit being configured to be connected to one of said plurality of first capacitor elements; and a decoupling arc carrier, on which a decoupling circuit is provided, said decoupling arc carrier being configured to be detachably connected to said second capacitor circular carrier, said decoupling circuit being configured to be connected to one of said plurality of second capacitor elements.

7. The radio frequency coil apparatus according to claim 6, wherein two ends of said inductor circular carrier, two ends of said first capacitor circular carrier, two ends of said second capacitor circular carrier, one end of said radio frequency feed-in arc carrier, and one end of said decoupling arc carrier extend outwards respectively to form mounting portions, said radio frequency feed-in arc carrier, said first capacitor circular carrier, said inductor circular carrier, said second capacitor circular carrier, and said decoupling arc carrier are configured to be detachably connected in turn, wherein every two adjacent mounting portions are configured to be capable of being sleeved or screwed with each other.

8. The radio frequency coil apparatus according to claim 7, wherein said radio frequency coil apparatus further comprises one or more fixing members, each used for fixing two mounting portions sleeved or screwed with each other together.

9. The radio frequency coil apparatus according to claim 6, wherein a first arc mounting member opposite to said first capacitor circular carrier is connected at one end of said radio frequency feed-in arc carrier, a second arc mounting member opposite to said second capacitor circular carrier is connected at one end of said decoupling arc carrier, said first arc mounting member and said second arc mounting member are used for mounting said radio frequency coil apparatus in a magnetic resonance imaging apparatus.

10. A magnetic resonance imaging apparatus, comprising:
a radio frequency coil apparatus comprising:
an inductor circular carrier, on which a plurality of inductor bars are provided at intervals circumferentially;
a first capacitor circular carrier, on which a plurality of first capacitor elements are provided circumferentially, said first capacitor circular carrier being configured to be detachably connected to one end of said inductor circular carrier, said plurality of first capacitor elements being plugged to one end of said plurality of inductor bars correspondingly; and
a second capacitor circular carrier, on which a plurality of second capacitor elements are provided circumferentially, said second capacitor circular carrier being configured to be detachably connected to the other end of said inductor circular carrier, said plurality of second capacitor elements being plugged to the other end of said plurality of inductor bars correspondingly.

\* \* \* \* \*